United States Patent
Yeo et al.

(10) Patent No.: US 6,703,271 B2
(45) Date of Patent: Mar. 9, 2004

(54) COMPLEMENTARY METAL OXIDE SEMICONDUCTOR TRANSISTOR TECHNOLOGY USING SELECTIVE EPITAXY OF A STRAINED SILICON GERMANIUM LAYER

(75) Inventors: Yee-Chia Yeo, Albany, CA (US); Chun Chieh Lin, Taichung (TW); Fu-Liang Yang, Hsin-Chu (TW); Chen Ming Hu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 115 days.

(21) Appl. No.: 10/002,031

(22) Filed: Nov. 30, 2001

(65) Prior Publication Data

US 2003/0162348 A1 Aug. 28, 2003

(51) Int. Cl.⁷ ........................................... H01L 21/8238
(52) U.S. Cl. ..................................... 438/221; 438/218
(58) Field of Search ............................... 438/218, 221, 438/199

(56) References Cited

U.S. PATENT DOCUMENTS

| | | | |
|---|---|---|---|
| 5,019,882 A | 5/1991 | Solomon et al. | 357/23.8 |
| 5,241,197 A | 8/1993 | Murakami et al. | 257/192 |
| 5,534,713 A | 7/1996 | Ismail et al. | 257/24 |
| 5,981,345 A | 11/1999 | Ryum et al. | 438/303 |
| 5,985,703 A | 11/1999 | Banerjee | 438/162 |
| 6,004,137 A | 12/1999 | Crabbé et al. | 437/40 |
| 6,111,267 A * | 8/2000 | Fischer et al. | 257/19 |
| 6,190,975 B1 * | 2/2001 | Kubo et al. | 438/285 |

OTHER PUBLICATIONS

Wolf, S.; Silicon Processing for the VLSI Era vol. 3: The Submicron MOSFET, Sunset Beach, CA, 1995, pp. 367–373.*

* cited by examiner

Primary Examiner—John F. Niebling
Assistant Examiner—Christopher Lattin
(74) Attorney, Agent, or Firm—George O. Saile; Stephen B. Ackerman

(57) ABSTRACT

A process for fabricating CMOS devices, featuring a channel region comprised with a strained SiGe layer, has been developed. The process features the selective growth of a composite silicon layer on the top surface of N well and P well regions. The composite silicon layer is comprised of a thin, strained SiGe layer sandwiched between selectively grown, undoped silicon layers. The content of Ge in the SiGe layer, between about 20 to 40 weight percent, allows enhanced carrier mobility to exist without creation of silicon defects. A thin silicon dioxide gate insulator is thermally grown from a top portion of the selectively grown silicon layer, located overlying the selectively grown SiGe layer.

12 Claims, 5 Drawing Sheets

COMPLEMENTARY METAL OXIDE SEMICONDUCTOR TRANSISTOR TECHNOLOGY USING SELECTIVE EPITAXY OF A STRAINED SILICON GERMANIUM LAYER

BACKGROUND OF THE INVENTION (1) Field of the Invention

The present invention relates to methods used to fabricate semiconductor devices, and more specifically to a method used to increase the performance of complementary metal oxide semiconductor (CMOS), devices, via the use of a channel region comprised in part with a strained silicon-germanium layer (2) Description of Prior Art An attractive approach for increasing CMOS transistor performance is the use of a silicon germanium (SiGe), layer located in the channel region of the CMOS device. The biaxial stress in the SiGe layer, creating strain induced band structure modification, allows enhanced transport properties of electrons for N channel (NMOS), devices, and enhanced transport properties of holes for P channel (PMOS), devices, to be realized. However the ability to place a SiGe layer in a region that will subsequently underlay the gate structure, as well as to subsequently accommodate shallow source/drain regions, can be challenging in terms of integrating the SiGe devices into a conventional CMOS process.

This invention will teach a process in which a SiGe layer is selectively grown on only the active device regions, eliminating the need for costly patterning procedures to remove portions of the SiGe layer overlying non-active device regions, such as insulator filled shallow trench regions. This invention will also describe a composite layer comprised with silicon layers overlying as well as underlying the SiGe component of the composite layer. The silicon layer overlying the SiGe layer, silicon cap layer, allows a gate insulator layer to be thermally grown consuming only a portion of the silicon cap layer. In addition, this invention will also describe the thickness and composition of the silicon cap, SiGe and silicon buffer layers, needed to accommodate the biaxial compressive strain needed for enhanced hole mobility in the PMOS channel region, and the strain induced energy splitting in the conduction band allowing enhanced electron transport properties to enhance electron velocity overshoot in the channel region of NMOS devices. Prior art, such as Ismail et al, in U.S. Pat. No. 5,534,713, describe the use of thick buffer layers, used with a SiGe layer, however the use of these thick layers may not allow for the easy integration into a conventional CMOS process as this present invention does.

SUMMARY OF THE INVENTION

It is an object of this invention to fabricate CMOS devices using a SiGe layer as a component of the channel region of a CMOS device.

It is another object of this invention to selectively grow on active device regions only, a composite silicon layer, comprised of a thin underlying silicon buffer layer, a thin SiGe layer, and an overlying, thin silicon cap layer.

It is still another object of this invention to incorporate between about 20 to 40 weight percent germanium (Ge), into the thin SiGe layer to obtain the desired stress characteristic for carrier mobility enhancement, without inducing junction leakage.

In accordance with the present invention a method of fabricating CMOS devices featuring a channel region comprised with a selectively grown, composite silicon layer, which in turn is comprised with a SiGe layer sandwiched between thin silicon layers, is described. After formation of shallow trench isolation (STI) regions in portions of a semiconductor substrate, an P well region is formed in a first region of the semiconductor substrate to be used for the NMOS devices while an N well region is formed in a second portion of the semiconductor substrate for accommodation of PMOS devices. A composite silicon layer is next selectively grown on regions of the semiconductor substrate not occupied by the STI regions. The composite silicon layer is comprised of an optional underlying silicon layer, a SiGe layer with a weight percent between about 20 to 40, and an overlying capping, silicon layer. A silicon dioxide gate insulator layer is next grown consuming a portion of the overlying, capping silicon layer, followed by deposition of, and patterning of, an undoped polysilicon layer, resulting in the formation of polysilicon gate structures for both NMOS and PMOS devices. After formation of lightly doped source/drain regions or extensions, in regions of the composite silicon layer not covered by the gate structures, insulator spacers are formed on the sides of the gate structures. An ion implantation procedure is then employed to place the desired P and N type ions in portions of the semiconductor structure not covered by the gate structures or by the insulator spacers, followed by a rapid thermal anneal (RTA) procedure, used to activate the P and N type ions, creating an N type, heavily doped source/drain region in a portion of the P well region, used for the NMOS devices, and creating a P type, heavily doped source/drain region in a portion of the N well region, for the PMOS devices. The implantation and anneal procedures used to form the heavily doped source/drain regions also results in the doping of the exposed polysilicon gate structures. Formation of metal silicide on the surface of gate structures and source/drain regions is then performed.

A second embodiment of this invention features the growth of an non-selective composite silicon layer, again comprised with the identical SiGe layer described in the first embodiment. The composite silicon layer is comprised of an optional underlying silicon layer, a SiGe layer, and an overlying silicon layer. Portions of the composite silicon layer located on the top surface of non-active regions, need to be selectively removed using photolithographic and dry etching procedures. In addition an optional modification used with the first embodiment entails the insulator filling of V-grooves located at the interface of the tapered top portion an STI regions, and the tapered sides of the selectively deposited composite silicon layer. This is accomplished post-deposition of the composite silicon layer via deposition of an insulator layer followed by a blanket dry etch procedure resulting in a smooth top surface topography featuring the insulator filled, V-groove shapes.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
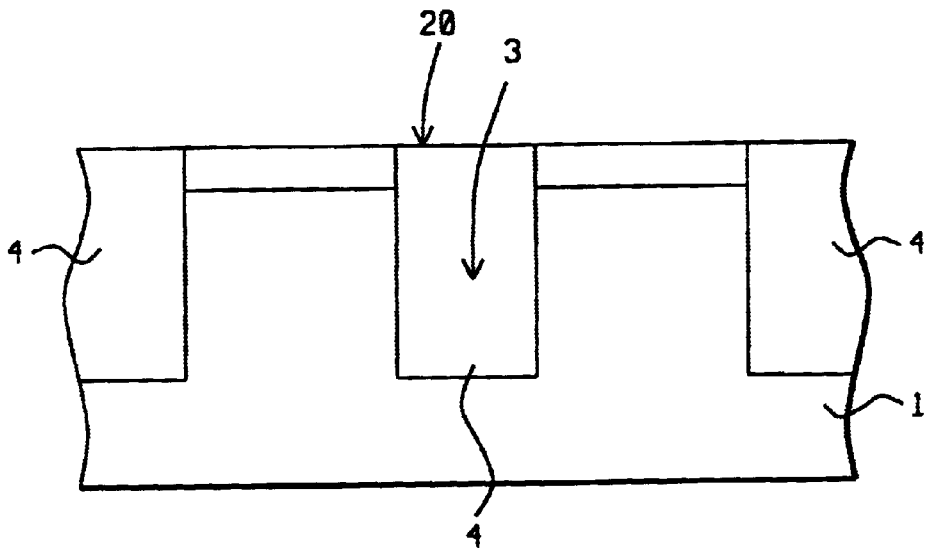
FIGS. 1–4, 6–9, which schematically, in cross-sectional style, describe key stages used to fabricate CMOS devices featuring a channel region comprised with a selectively grown, composite silicon layer, which in turn is comprised with a SiGe layer sandwiched between thin silicon buffer layers, is described.

The method of fabricating a CMOS device featuring a composite silicon layer, comprised of at least a SiGe layer and an overlying silicon layer, selectively grown on active device regions of a semiconductor substrate prior to growth of a gate insulator layer, will now be described in detail. Semiconductor substrate 1, comprised of single crystalline, P type silicon, featuring a <100> crystallographic orientation, is used and schematically shown in FIG. 1. Silicon nitride layer 2, at a thickness between about 1000 to 2000 Angstroms, is formed on the top surface of semiconductor substrate 1, via low pressure chemical vapor deposition (LPCVD), or plasma enhanced chemical vapor deposition (PECVD), procedures. Conventional photolithographic and reactive ion etching (RIE), procedures are used to define shallow trench shapes 3, in silicon nitride layer 2, and to a depth between about 3000 to 6000 Angstroms in semiconductor substrate 1. The RIE procedure is performed using $Cl_2$ as an etchant for both silicon nitride layer 2, and semiconductor substrate 1. After removal of the photoresist shape used to define shallow trench shapes 3, via plasma oxygen ashing procedures, silicon oxide layer 4, is deposited via LPCVD or PECVD procedures at a thickness between about 4000 to 10000 Angstroms, using tetraethylorthosilicate (TEOS), as a source, completely filling shallow trench shapes 3. A chemical mechanical polishing (CMP) procedure is then employed to remove portions of silicon oxide layer 4, from the top surface of silicon nitride layer 2, resulting in silicon oxide filled, STI regions 20, schematically shown in FIG. 1. The CMP procedure selectively terminates on silicon nitride layer 2.

Figure 2:
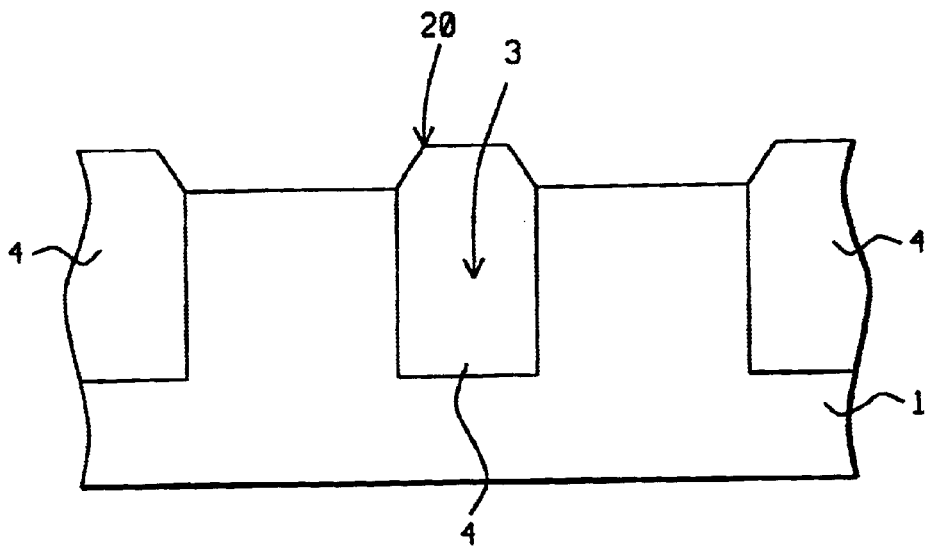
Figure 3:
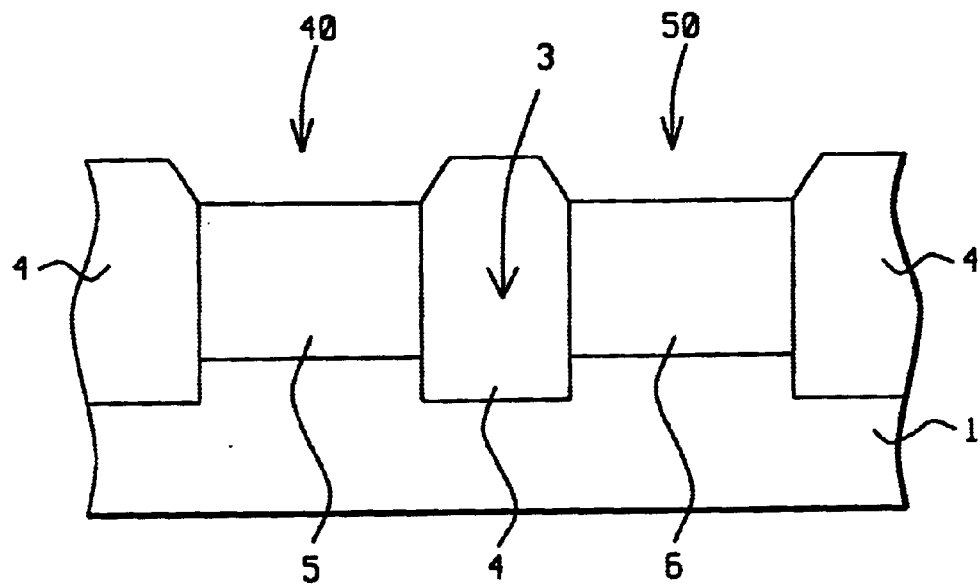

The removal of silicon nitride layer 2, via wet etch procedures, using phosphoric acid as an etchant, is next conducted, with the etch procedure also presenting an isotropic component resulting in a tapered profile for the top portion of STI regions 20, with the top portions of STI regions 20, extending above the top surface of semiconductor substrate 1. This is schematically shown in FIG. 2 The formation of well regions is next addressed and schematically shown in FIG. 3. A photoresist shape (not shown in the drawings), is first used to block a portion of semiconductor substrate 1, from an ion implantation procedure performed using boron ions at an energy between about 100 to 400 KeV, and at a dose between about 1E12 to 1E14 atoms/$cm^2$, creating P well region 5. At this stage of the CMOS fabrication procedure additional ion implantation procedures can be used to adjust the threshold voltage of the NMOS and PMOS devices, in addition to adjusting portions of the substrate to offer greater protection against punch-through phenomena. The region of semiconductor substrate 1, in which P well 5, resides, will be designated as NMOS region 40, to be used to accommodate NMOS devices. After removal of the photoresist block out shape, another photoresist shape (not shown in the drawings) is used to protect NMOS region 40, from implantation of arsenic or phosphorous ions, performed at an energy between 100 to 500 KeV, at a dose between about 1E12 to 1E14 atoms/$cm^2$, resulting in the formation of N well region 6, in a portion of semiconductor substrate 1, designated as PMOS region 50, to be used to accommodate PMOS devices. If not previously performed threshold adjust and anti-punch through implants may now be performed. Removal of the photoresist block out shapes is accomplished via plasma oxygen ashing procedures.

Figure 4:
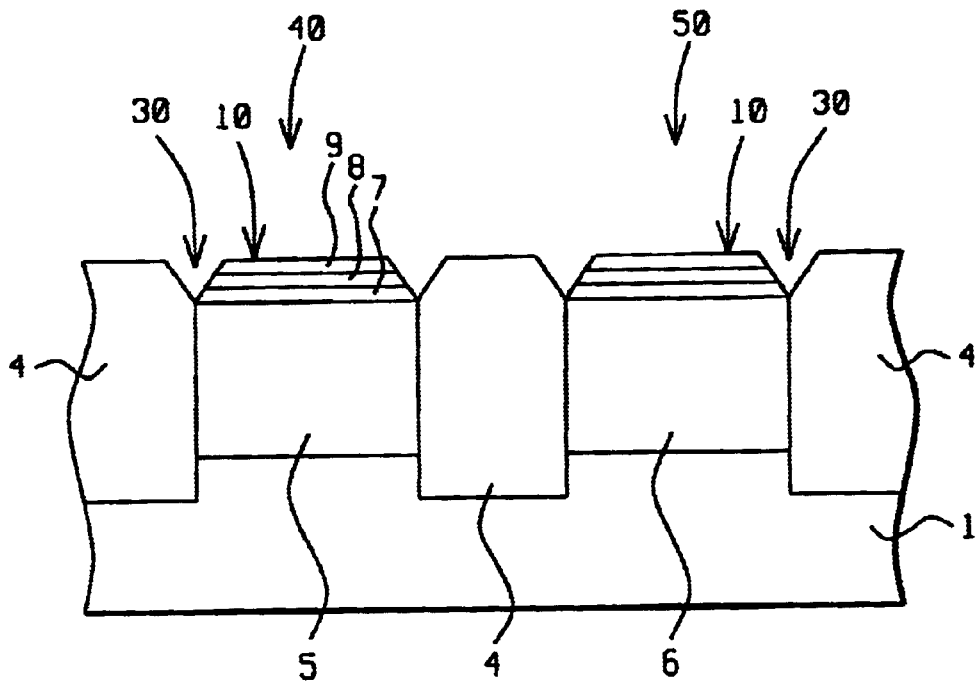

After a pre-clean procedure performed using a dilute or buffered hydrofluoric acid solution, composite silicon layer 10, is selectively grown on exposed semiconductor surfaces. An ultrahigh vacuum chemical vapor deposition (UHV-CVD) procedure is employed at a temperature between about 400 to 800° C. To obtain the desired selective growth specific conditions, such as the growth temperature, (shown above), in addition to a pressure of less than 200 mtorr, have to be employed. The addition of chlorine gas or HCl gas enhances the selectivity of the epitaxial growth. The growth of composite silicon layer 10, shown schematically in FIG. 4, initiates with the growth of optional underlying undoped silicon layer 7, selectively grown using silane ($SiH_4$), or disilane ($Si_2H_6$), as a source, to a thickness between about 0 to 100 Angstroms. This is followed by the selective growth of undoped SiGe layer 8, at a thickness between about 20 to 150 Angstroms, using silane ($SiH_4$) or disilane ($Si_2H_6$), and germane ($GeH_4$) as reactants. The objective of growing a strained SiGe layer is achieved using a germanium weight percent between about 20 to 40. The thickness is chosen to be sufficient enough to contain the inversion charge, however not thick enough to allow defect to lead to unwanted device leakage. Finally overlying undoped silicon layer 9, is selectively grown to a thickness between about 5 to 100 Angstroms, again using silane or disilane as a source. Overlying silicon layer 9, is used as a capping layer, allowing a silicon dioxide gate insulator layer to be subsequently formed using silicon located in a top portion of this layer. The selective growth of composite silicon layer 10, results in a tapered sidewall, which in combination with the tapered profile of the top portion of STI region 4, result in V-groove shape 30, located between the tapered shapes of composite silicon layer 10, and STI regions 4. This is illustrated schematically in FIG. 4.

Figure 5:
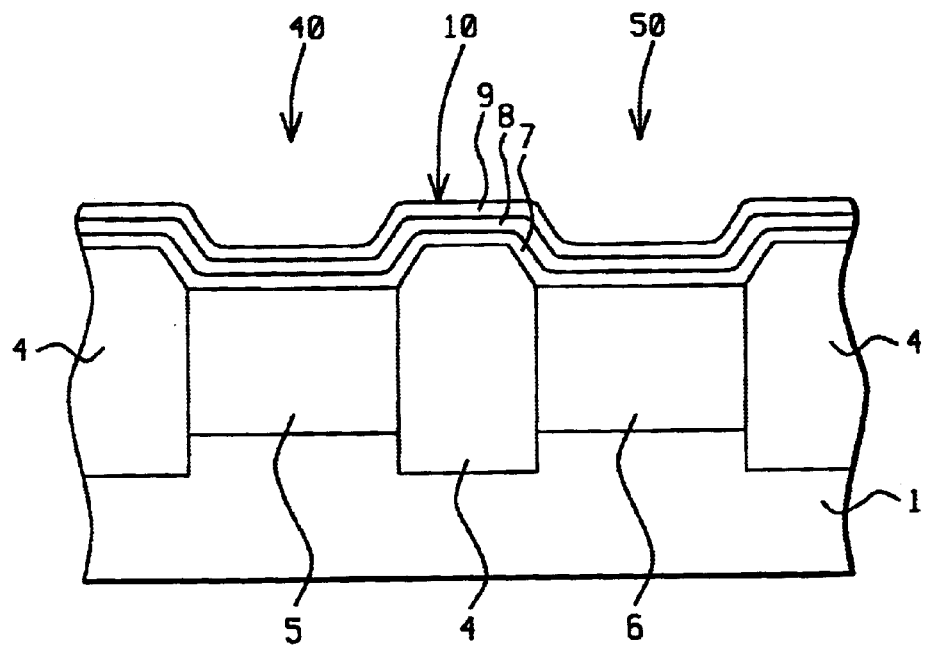
FIG. 5, which schematically, in cross sectional style, shows a key stage of a CMOS process featuring a nonselectively grown, composite silicon layer, to be defined as a component of the CMOS device channel region.

A second embodiment of this invention relates to the non-selective growth of composite silicon layer 10. Composite silicon layer 10, is again comprised of an optional underlying, undoped silicon layer 7, a SiGe layer 8, and an overlying, undoped silicon layer 9, all at the same thickness as used with the first embodiment featuring the selective silicon growth option. However to form a non-selective silicon layer the growth temperature used, unlike the selective silicon counterpart, is between about 400 to 800° C., in addition to employing a pressure less than 200 mtorr. This is schematically illustrated in FIG. 5. The second embodiment, or the use of non-selective silicon growth, will subsequently require a patterning procedure to remove portions of the non-selective silicon layer from non-active device regions, such as from the top surface of STI regions 4.

Figure 6:
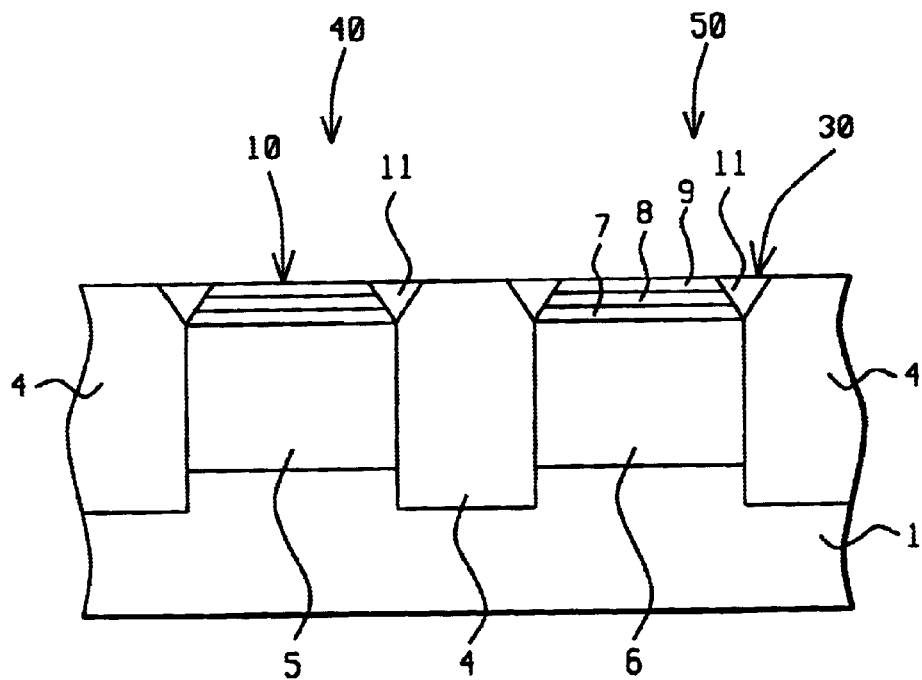

The filling of V-grooves 30, with insulator, employed as an option or modification in this invention, is next addressed and schematically shown in FIG. 6. Insulator layer 11, comprised of either silicon oxide or silicon nitride, is deposited via LPCVD or PECVD procedures, to a thickness between about 100 to 1000 Angstroms, completely filling V-grooves 30. A reactive ion etch (RIE) procedure is then used to selectively remove the insulator layer 11, from the top surface of composite silicon layer 10, resulting insulator filled V-grooves. The high etch rate ratio of insulator layer 11, to silicon, using $CHF_3$ or $CF_4$ as an etchant, allows the selective RIE procedure to be easily terminated at the appearance of the top surface of composite silicon layer 10. If desired a chemical mechanical polishing procedure can be used to remove portions of insulator layer 11, from the top surface of composite silicon layer 10, again resulting in the formation of insulator filled, V-grooves.

Figure 7:
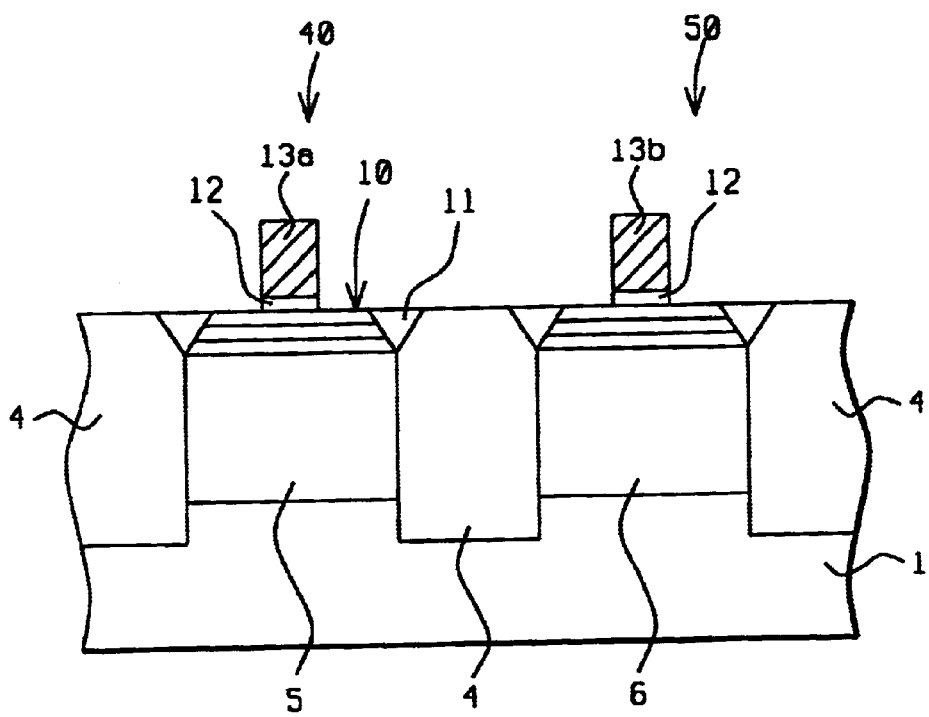

Thermal oxidation procedures are next employed at a temperature between about 600 to 900° C., in an oxygen-steam ambient, resulting in the growth of silicon dioxide gate insulator layer 12, at a thickness between about 5 to 80 Angstroms. Silicon dioxide gate insulator layer 12, was obtained consuming only a top portion of overlying silicon layer 9. The presence of overlying silicon layer 9, prevented the thermal oxidation procedure from consuming portions of strained SiGe layer 8, which would have resulted in a silicon dioxide layer exhibiting poorer dielectric characteristics than the silicon oxide gate insulator layer grown from an underlying non-Ge, silicon layer. An undoped polysilicon layer is next deposited at a thickness between about 500 to 2000 Angstroms, via LPCVD procedures. Conventional photolithographic and anisotropic RIE procedures, using $Cl_2$ or $SF_6$ as an etchant, are used to define polysilicon gate structure 13a, in NMOS region 40, and polysilicon gate structure 13b, residing in PMOS region 50. The width of the polysilicon gate structures is between about 180 to 5000 Angstroms. Removal of the photoresist shape, (not shown in the drawings), used as a defining mask for the polysilicon gate structures, is then removed via plasma oxygen ashing procedures and careful wet cleans. The wet clean procedures include the use of a buffered or dilute HF cycle which remove exposed portions, or portions of silicon dioxide gate insulator layer 12, not covered by the polysilicon gate structures, from the top surface of composite silicon layer 10. The result of these procedures is schematically shown in FIG. 7.

Figure 8:
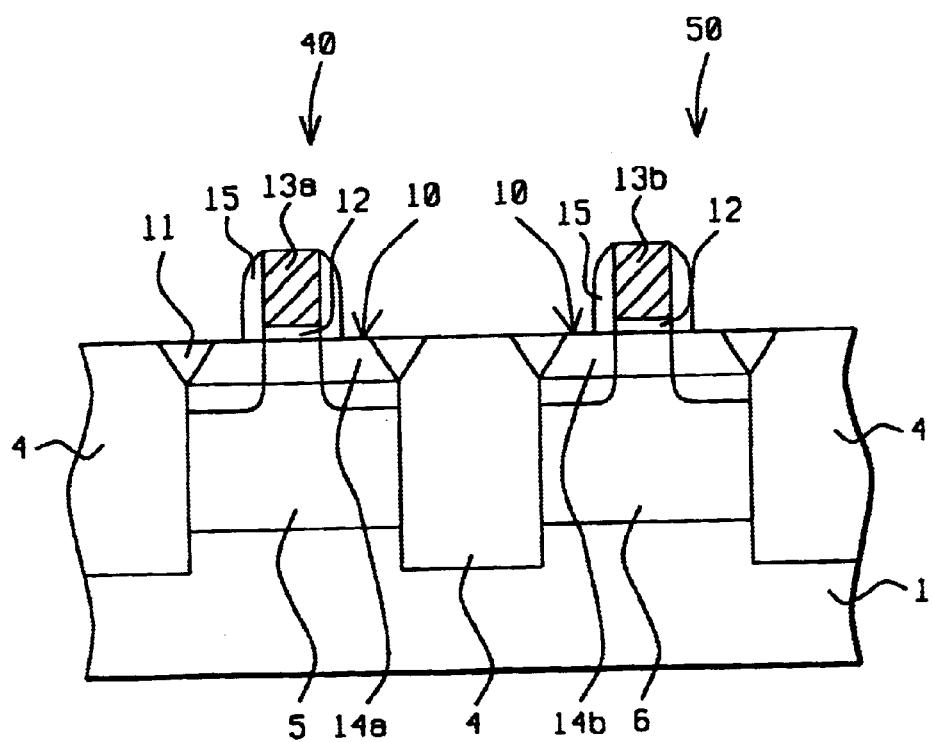

Lightly doped source/drain (LDD), regions, or source/drain extensions are next formed in both NMOS region 40, and PMOS region 50. For purposes of clarity composite silicon layer 10, will now be displayed without showing each of the three silicon components. A photoresist shape, (not shown in the drawings), is used to block NMOS region 40, from implantation of boron ions, performed at an energy less than 5 KeV, and at a dose between about 1E15 to 1E16 atoms/cm$^2$, resulting in P type, LDD region 14b, in the portion of PMOS region 50, or in a region of composite silicon layer 10, not covered by polysilicon gate structure 13b. After removal of the NMOS block out photoresist shape, another photoresist block out shape is formed on PMOS region 50, allowing implantation of arsenic or phosphorous ions, at an energy less than 10 KeV, and at a dose between about 1E15 to 1E16 atoms/cm$^2$, to create N type, LDD region 14a, in a region of NMOS region 40, or in a region of composite silicon layer 10, not covered by the photoresist block out shape or by polysilicon gate structure 13a. After removal of the PMOS block out photoresist shape a silicon nitride layer is deposited via LPCVD or PECVD procedures, to a thickness between about 500 to 2000 Angstroms. An anisotropic RIE procedure using $SF_6$ as an etchant is used to define silicon nitride spacers 15, on the sides of the polysilicon gate structures. The result of these procedures is schematically shown in FIG. 8

Figure 9:
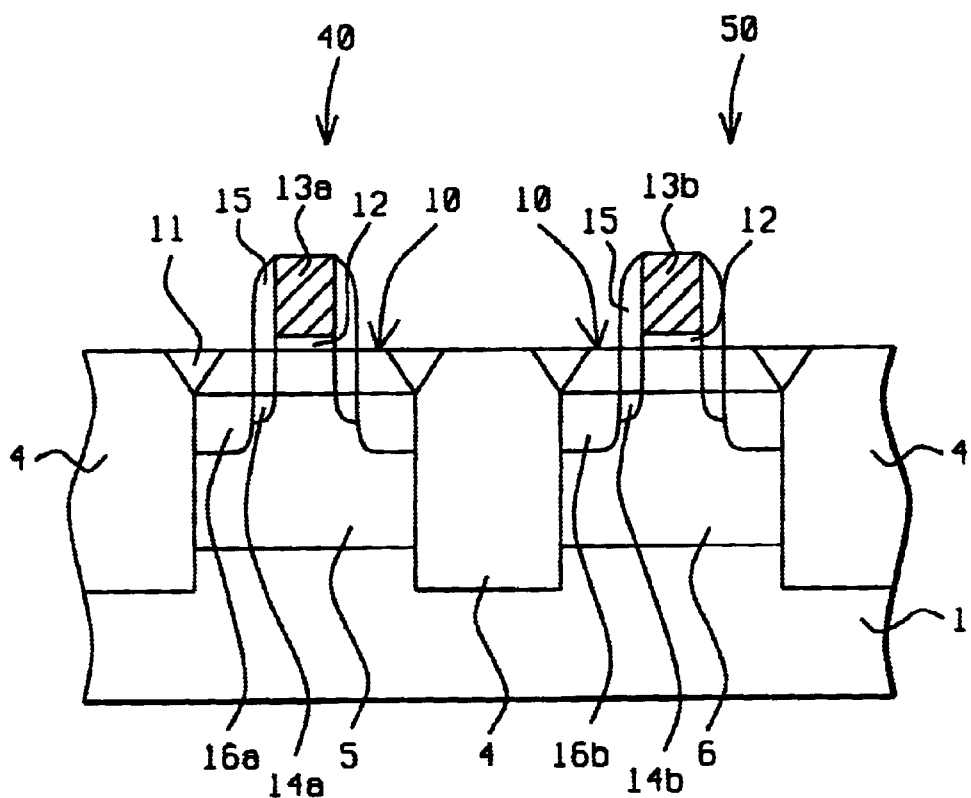

Formation of the heavily doped source/drain regions are next addressed and schematically shown in FIG. 9. A photoresist block out shape is used to protect the NMOS region 40, from implantation of boron ions into a portion of PMOS region 50, not covered by polysilicon gate structure 13b, or by silicon nitride spacers 15. The implantation procedure is performed at an energy between about 1 to 20 KeV, and at a dose between about 1E15 to 1E16 atoms/cm$^2$. After removal of the photoresist shape used to block out NMOS region 40, another photoresist shape is formed overlying PMOS region 50, allowing arsenic or phosphorous ions to be implanted into portions of NMOS region 40, not covered by polysilicon gate structure 13a, or by silicon nitride spacers 15. After removal of the photoresist shape used to protect PMOS region 50, from the N type implantation procedure, an anneal procedure is employed to activate the P type, and N type implanted ions, resulting in heavily doped P type source/drain region 16b, in PMOS region 50, and in heavily doped N type source/drain region 16a, in NMOS region 40. The anneal procedure was accomplished using rapid thermal annealing (RTA), performed at a temperature between about 925 to 1075° C., for a time between about 0 to 30 sec. The presence of SiGe layer 8, as a component of composite silicon layer 10, helps to restrict excessive diffusion of activated boron in the vertical direction that would lead to increased source/drain junction depth and degraded short-channel performance.

Completion of the CMOS process sequence, featuring a composite silicon layer comprised of at least a SiGe layer and an overlying silicon layer, entails formation of metal silicide layers on the top surface of the polysilicon gate structures, and on the top surface of the heavily doped source/drain regions. Several alternatives to forming the metal silicide layer directly on the composite silicon layer, in which unwanted agglomeration of germanium may occur at the boundaries of the silicide layer, can be employed. First the composite silicon layer can be removed prior to metal silicide formation, specifically after silicon nitride spacer formation. A second alternative is an additional selective epitaxial growth of silicon, used to form a raised source/drain region, so that a subsequent silicide formation procedure would not consume the underlying SiGe layer. The metal used for silicide formation, in either of the above alternatives can be chosen from a group that contained such candidates as titanium, tantalum cobalt, nickel, or tungsten. After deposition of the metal layer, anneal procedures are used to form the metal silicide layer on the gate and source/drain elements, followed by removal of unreacted metal from the surface of the spacers and STI regions.

While this invention has been particularly shown and described with reference to, the preferred embodiments thereof, it will be understood by those skilled in the art that various changes in form and details may be made without departing from the spirit and scope of this invention.

What is claimed is:

1. A method of forming CMOS devices featuring a channel region formed in a selectively grown, composite silicon layer, wherein said composite silicon layer is comprised of at least a strained SiGe layer and an overlying silicon layer, comprising the steps of:

providing a first region of said semiconductor substrate to be used as an NMOS region, and providing a second region of said semiconductor substrate to be used as a PMOS region;

forming shallow trench isolation (STI) regions in top portions of said semiconductor substrate, with a top portion of each STI region featuring tapered sides;

forming a P well region in a top portion of said NMOS region, and forming an N well region in a top portion of said PMOS region;

selectively depositing a composite silicon layer on the top surface of said P well region and on the top surface of said N well region, with said composite silicon layer featuring tapered sides, resulting in V-groove openings located between said tapered sides of said STI regions and tapered sides of said composite silicon layer, and with said composite silicon layer comprised of a silicon layer, a strained SiGe layer, and an overlying silicon layer;

depositing an insulator layer;

removing portion of insulator layer from the top surface of said composite insulator layer resulting in insulator filled V-grooves located between said STI regions and said composite silicon layer; and thermally oxidizing a top portion of said overlying silicon layer to form a silicon dioxide gate insulator layer on a bottom portion of said overlying silicon layer.

2. The method of claim 1, wherein said STI regions are silicon oxide filled shallow trench shapes, formed to a depth between about 3000 to 6000 Angstroms in said semiconductor substrate.

3. The method of claim 1, wherein said composite silicon layer is obtained via ultra-high vacuum chemical vapor deposition (UHV-CVD) procedures, at a temperature between about 400 to 800° C., and at a pressure less than 200 mtorr.

4. The method of claim 1, wherein said SiGe layer is grown on an underlying silicon layer.

5. The method of claim 1, wherein said silicon layer of said composite silicon layer, underlying said SiGe layer, is selectively grown to a thickness between about 0 to 100 Angstroms, using silane or disilane as a source.

6. The method of claim 1, wherein said strained SiGe layer of said composite silicon layer, is selectively grown to a thickness between about 20 to 150 Angstroms.

7. The method of claim 1, wherein said strained SiGe layer of said composite silicon layer, is selectively grown with a germanium content between about 20 to 40 weight percent.

8. The method of claim 1, wherein said strained SiGe layer of said composite silicon layer, is selectively grown using silane or disilane, and germane as reactants.

9. The method of claim 1, wherein said overlying silicon layer of said composite silicon layer, is selectively grown to a thickness between about 5 to 100 Angstroms using silane or disilane as a source.

10. The method of claim 1, wherein said insulator layer, used to fill said V-groove openings, is a silicon oxide layer, obtained via deposition of a silicon oxide layer at a thickness between about 100 to 1000 Angstroms.

11. The method of claim 1, wherein removal of said insulator layer used to form said insulator filled V-grooves, is accomplished via reactive ion etching procedures.

12. The method of claim 1, wherein said silicon dioxide gate insulator layer is obtained at a thickness between about 5 to 80 Angstroms, via thermal oxidation procedures performed at a temperature between about 600 to 900° C., in an oxygen-steam ambient.

* * * * *